(12) United States Patent
Van Zanten et al.

(10) Patent No.: US 7,088,926 B2
(45) Date of Patent: Aug. 8, 2006

(54) ELECTRO-OPTICAL CONNECTOR MODULE

(75) Inventors: Albertus Van Zanten, Hertogenbosch (NL); Winnie Heyvaert, Velddriel (NL)

(73) Assignee: Framatome Connectors International, Courbevoie (FR)

( * ) Notice: Subject to any disclaimer, the term of this patent is extended or adjusted under 35 U.S.C. 154(b) by 421 days.

(21) Appl. No.: 09/777,315

(22) Filed: Feb. 5, 2001

(65) Prior Publication Data
US 2001/0026388 A1 Oct. 4, 2001

(30) Foreign Application Priority Data
Feb. 8, 2000 (NL) .................................. 1014313

(51) Int. Cl.
*H04B 10/00* (2006.01)
(52) U.S. Cl. .................. 398/164; 398/140; 398/135; 398/138; 398/139; 398/128; 398/130; 398/41; 398/42; 385/88; 385/89; 385/92; 385/93; 385/14; 438/107; 438/109; 365/52; 365/63; 361/749; 361/750
(58) Field of Classification Search ............... 398/164, 398/140, 135, 138, 128, 130, 163, 182, 202, 398/139, 41, 42; 385/92, 88, 89, 93, 14; 438/107, 109; 365/52, 63; 361/749, 750
See application file for complete search history.

(56) References Cited
U.S. PATENT DOCUMENTS 3,766,439 A    10/1973  Isaacson ..................... 317/100
4,149,072 A    4/1979   Smith et al. ................. 250/199
5,204,925 A    4/1993   Bonanni et al. .............. 385/89
5,448,511 A *  9/1995   Paurus et al. ................ 365/52
5,776,797 A *  7/1998   Nicewarner et al. ........ 438/107
5,875,047 A    2/1999   Abe et al. .................... 359/152
6,056,448 A *  5/2000   Sauter et al. ................. 385/92
6,130,979 A *  10/2000  Isaksson et al. ............. 385/89
6,160,647 A *  12/2000  Gilliland et al. ............. 398/23
6,213,651 B1 * 4/2001   Jiang et al. .................. 385/92
6,456,720 B1 * 9/2002   Brimhall et al. ............ 381/324
6,901,221 B1 * 5/2005   Jiang et al. ................ 398/138

FOREIGN PATENT DOCUMENTS

DE    3908786 A1   8/1989
DE    3809972 A1   10/1989
EP    0566354 A1   10/1993
EP    0710861 A1   5/1996

* cited by examiner

*Primary Examiner*—Hanh Phan
(74) *Attorney, Agent, or Firm*—Perman & Green, LLP

(57) ABSTRACT

The invention pertains to an electro-optical connector module comprising a connection part, at least one optical transmitter circuit and/or optical receiver circuit and at least one electro-optical converter for respectively converting electrical signals into optical signals or vice versa. The module further comprises at least two substantially flat and substantially parallel electrically insulating sheets on which the transmitter circuit and/or receiver circuit and the converter are mounted. It is preferred that the connector module according, comprises at least one optical transmitter circuit, at least one optical receiver circuit and at least two electro-optical converters for respectively converting electrical signals into optical signals and vice versa, wherein the optical transmitter circuit and a first converter are mounted on a first sheet and the optical receiver circuit and a second converter are mounted on a second sheet.

7 Claims, 2 Drawing Sheets

ELECTRO-OPTICAL CONNECTOR MODULE

BACKGROUND OF THE INVENTION

The invention pertains to an electro-optical connector module comprising a connection part, such as a header or a receptacle for connection to a counterpart, at least one optical transmitter circuit and/or optical receiver circuit and at least one electro-optical converter for respectively converting electrical signals into optical signals or vice versa.

Such electro-optical connector modules are known from U.S. Pat. No. 4,149,072 and are more and more employed when high-rate transmissions (up to 10 Gbits/s) are required.

It is an object of the present invention to provide an improved electrical optical connector module of the kind described above.

BRIEF SUMMARY OF THE INVENTION

To this end, the electro-optical connector module according to the present invention comprises at least two substantially flat and substantial parallel electrically insulating sheets on which the transmitter circuit and/or receiver circuit and the converter are mounted.

By using two or more of such sheets, the size of the module can be drastically reduced, preferably at least to the external dimensions of existing electrical connectors such as those of the Metral® or Millipacs® type.

A preferred electro-optical connector module according to the present invention comprises at least one optical transmitter circuit, at least one optical receiver circuit and at least two electro-optical converters for respectively converting electrical signals into optical signals and vice versa, wherein the optical transmitter circuit and a first converter are mounted on a first sheet and the optical receiver circuit and the second converter are mounted on a second sheet. Thus, the components needed for transmitting and the components needed for receiving are separated to the maximum extent possible and interference or crosstalk are reduced. Further, connections between the said components can be kept as simple and short as possible.

It is further preferred that the sheets are connected by means of a flexible material. In that case the sheets and the connecting parts, for instance, can be cut or punched from a flexible foil and thus form an integral whole. Another possibility, for instance, is the use of so-called semi-rigid printed circuit boards or PCB's, which comprise two or more rigid sheets attached to a flexible substrate. As a result of the flexible connection, the components can be attached to the sheets whilst a maximum of space is available and the sheets can subsequently be folded to minimise the size of the eventual module.

In those cases where the module comprises at least three substantially flat and substantially parallel electrically insulating sheets that are preferably also substantially square or rectangular and wherein the first and the second sheet are connected to adjacent sides of the third sheet by means of a flexible sheet material, folding can be carried out in two (preferably perpendicular) directions, thus further increasing the possibilities of keeping the module as small as possible and allowing maximum use of raw material (in this case flexible foil).

In general, it is preferred that the electro-optical connector module according to the present invention comprises an effective shielding, so as to protect the module from Electro Magnetic Interference or EMI.

It is further preferred that the connection part of the module comprises a housing of an insulating material for accommodating one or more contact elements and that the housing is used to provide mechanical strength to the entire structure by attaching the sheets to the said housing. In an especially advantageous embodiment, the housing comprises building blocks to some or each of which one of the sheets is attached.

The invention further pertains to a method of making an electro-optical connector module that comprises sheets that are connected by means of a flexible sheet material, wherein the sheets are folded and fixed with respect to one another.

The invention will be further explained with reference to the drawings in which two embodiments of the connector module according to the present invention are schematically shown.

BRIEF DESCRIPTION OF THE FIGURES OF THE DRAWING

FIG. 1 shows as an example an electro-optical connector module 1 comprising an electrical connection section 2 and, opposite this section 2, an optical connection section 3. The connector module 1 is provided with polarizing protrusions 4, 4' on two opposite sides of the connector module 1. Further, EMI shielding is provided by a hood 5 that, in this case, is manufactured from a thin metal sheet and that comprises three protrusions 6 on two opposite sides for grounding the shielding. The optical connection section 3 comprises an optical connector part 7 that comprises two alignment holes 8 and the ends of in this case eight optical fibers 9.

DETAILED DESCRIPTION OF THE INVENTION

Figure 1:
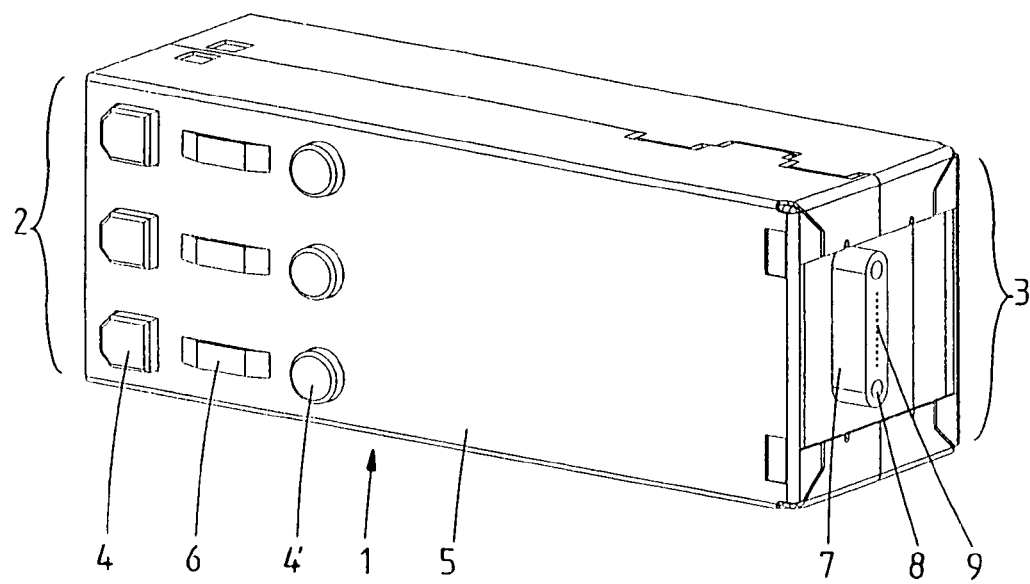
FIG. 1 shows a perspective view of a first embodiment of the connector module according to the present invention.
Figure 2:
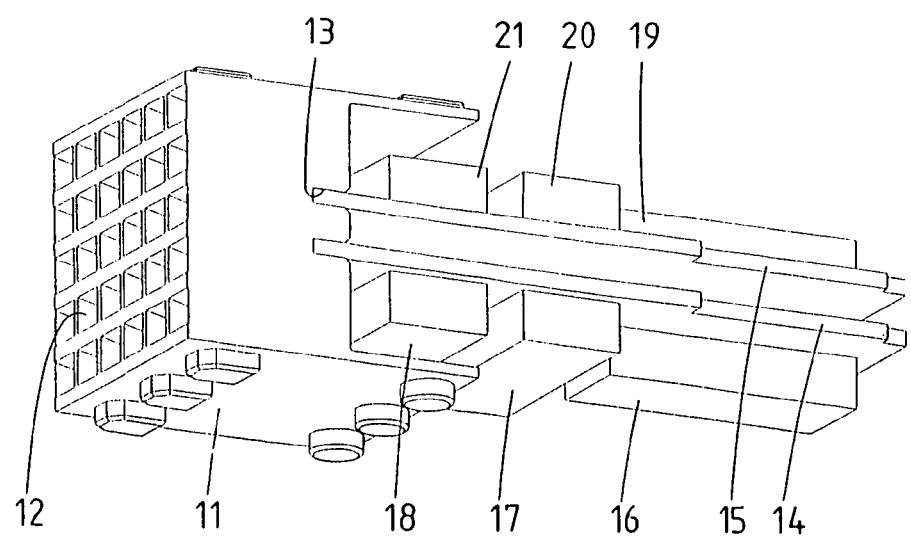
FIG. 2 shows the connector module according to FIG. 1 with the shielding material removed and rotated 90 degrees about its central longitudinal axis.

As can be seen in FIG. 2, which shows the connector module 1 according to FIG. 1 without the hood 5 and without the optical connection section 3, the electrical connection section 2 comprises a housing 11 of an electrically insulating material such as, e.g., plastic. The housing 11 comprises 5×6 positions 12 each of which contains a contact element (not shown). The function of the contact elements varies; some will serve to guide an electrical signal that is to be converted and transmitted or a received signal, whereas others will serve for power supply to and grounding of the components contained in the connector module 1.

In the present example, the housing 11 comprises two slots 13 with PCB's 14, 15 secured therein. The first PCB 14 is provided with a receiver 16 that contains four PIN-diodes (not shown). The receiver 16 is optically connected to four of the eight optical fibers 9 so as to be able to receive optical signals, e.g. from a cable attached to the connector module 1. The detector 16 is electrically connected to a preamplifier 17 which in turn is connected to a decoder 18. The decoder 18 is connected to the contact elements contained in the housing 11. The second PCB 15 comprises a transmitter 19 that contains four vertical cavity surface emitting lasers or VCSEL's (not shown) that are optically connected to four of the optical fibers 9. The laser 19 is electrically connected to a driver 20 and an encoder 21. All electrical connections within the connector module 1 are established by means of so-called differential pairs.

By using the two parallel PCB's 14, 15, the connector module 1 can be small in size and it can be designed in such a way that it is pin-to-pin compatible with existing receptacles or headers.

Figure 3:
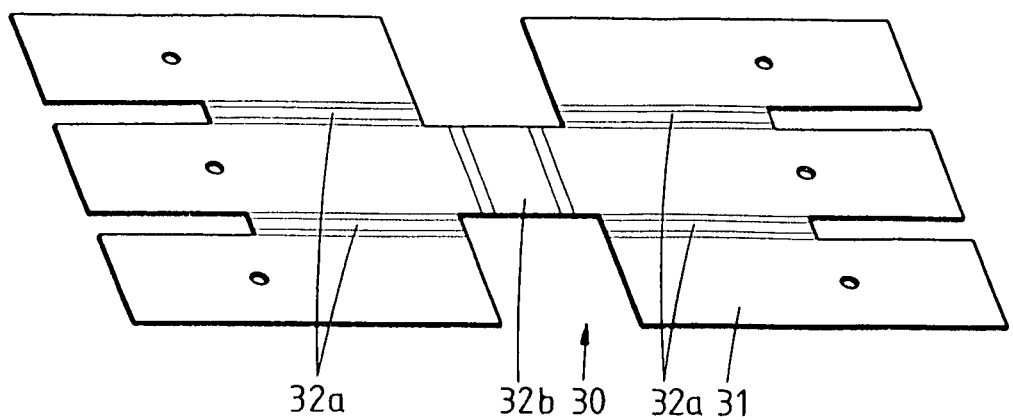
FIG. 3 shows a core component of a second embodiment of the connector module according to the present invention.
Figure 4:
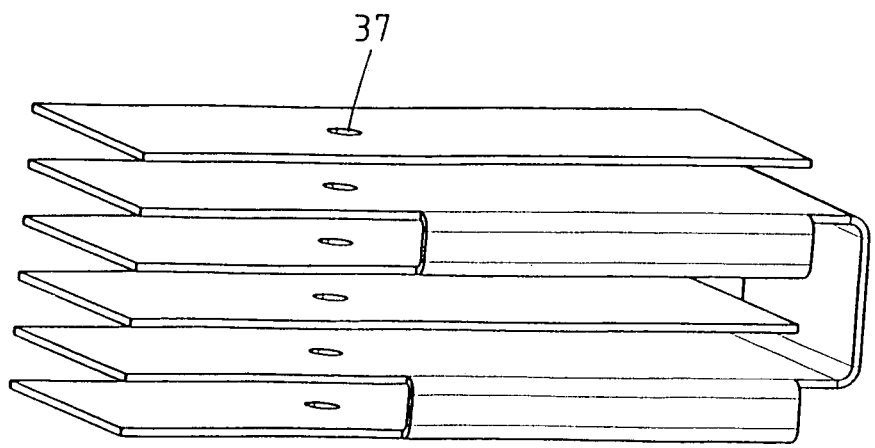
FIG. 4 shows the component of FIG. 3 in a folded position.
Figure 5:
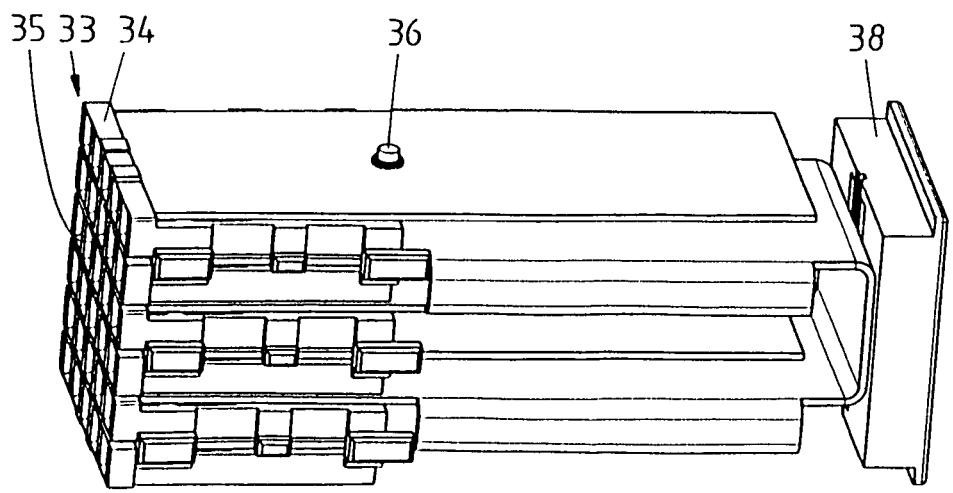
FIG. 5 shows the folded component of FIG. 4 with some parts of a connection means attached to it.

FIG. 3 shows a flat foil 30 consisting of six rectangular sheets 31, which are connected by means of intermediate sections 32a, 32b that are, as a matter of course, also flexible. FIG. 4 shows how the flat foil 30 according to FIG. 3 can be folded into a very compact structure comprising six parallel rectangular sheets 31. Further, FIG. 5 shows a housing 33 that consists of six building blocks 34 each of which contains five positions 35 for accommodating a contact element. Each of the building blocks 34 can be attached to a corresponding sheet 31 prior to the folding of the flat foil 30. Upon folding of the flat foil 30, mechanical strength is inherently provided by the housing 33. Mechanical strength and positioning of the structure can be further improved by using a pin 36 that is fitted through holes 37 that are provided in the sheets 31.

Upon folding the flat foil 30 and fixing the positions thereof, an optical connection section 38 can be attached to the intermediate section 32b. The intermediate sections 32a, 32b may already contain optical and/or electrical leads and/or a rigid part.

It will be clear from the above explanation, that this second embodiment can be assembled quickly and securely.

The invention is not restricted to the above described embodiments which can be varied in a number ways within the scope of the claims. More particularly, as is well-known, each transmitter can be used as a receiver and vice versa. So, on both flat insulating sheets we can find the same components able to work as a transmitter or receiver.

The invention claimed is:

1. Electro-optical connector module comprising:
    an optical connection section for receiving and/or transmitting optical signals;
    an electrical connection section for receiving and/or transmitting electrical signals;
    said module comprising at least two substantially flat and substantially parallel electrically insulating sheets, at least one optical transmitter circuit, at least one optical receiver circuit and at least two electrooptical converters for respectively converting electrical signals into optical signals and vice versa, wherein the optical transmitter circuit and a first converter are mounted on the first sheet and the optical receiver circuit and a second converter are mounted on the second sheet, wherein the sheets are connected by means of a flexible sheet material; and
    wherein a component for optical input and/or output is provided on the connecting flexible sheet material and wherein the connecting flexible sheet material can also comprise a rigid part.

2. Electro-optical connector module according to claim 1, which comprises a least three substantially flat and substantially parallel electrically insulating sheets that are substantially square or rectangular and wherein the first and the second sheet are connected to adjacent sides of the third sheet by means of a flexible sheet material.

3. Electro-optical connector module according to claim 1, which comprises a hood capable of shielding said module against electromagnetic interference.

4. Electro-optical connector module according claim 1, wherein the electrical connection section comprises a housing of an insulating material for accommodating one or more contact elements and wherein the sheets are attached to the said housing.

5. Electro-optical connector module according to claim 4, wherein the housing comprises building blocks to which a sheet is attached.

6. A method of making an electrooptical connector module, the module having at least two substantially flat and substantially parallel electrically insulating sheets, at least one optical transmitter circuit, at least one optical receiver circuit and at least two electro-optical converters for respectively converting electrical signals into optical signals and vice versa, said method comprising the steps of:
    mounting at least one optical transmitter circuit and a first of said electro-optical converters on one of the electrical insulating sheets;
    mounting a second one of said electro-optical converters on the other of said electrical insulating sheets;
    connecting said electrical insulating sheets by means of a flexible sheet material;
    folding the sheets and fixing the position of the sheets with respect to one another; and
    providing a component for optical input and/or output on the connecting flexible sheet material and wherein the connecting flexible sheet material can also comprise a rigid part.

7. Method according to claim 6, further comprising the step of constructing the electrical connection section to comprise a housing of an insulating material for accommodating one or more contact elements, said housing being further constructed to comprise building blocks and wherein at least some of the building blocks are attached to corresponding sheets prior to the folding of the sheets.

* * * * *